(12) United States Patent
Zaiss et al.

(10) Patent No.: US 11,169,235 B2
(45) Date of Patent: Nov. 9, 2021

(54) METHOD AND APPARATUS FOR PROCESSING MAGNETIC RESONANCE DATA

(71) Applicants: Max-Planck-Gesellschaft zur Foerderung der Wissenschaften e. V., Munich (DE); Eberhard Karls Universitaet Tuebingen, Tuebingen (DE)

(72) Inventors: Moritz Zaiss, Tuebingen (DE); Anagha Deshmane, Kusterdingen (DE); Klaus Scheffler, Tuebingen (DE)

(73) Assignees: Max-Planck-Gesellschaft zur Foerderung der Wissenschaften e. V., Munich (DE); Eberhard Karls Universitaet Tuebingen, Tuebingen (DE)

( * ) Notice: Subject to any disclaimer, the term of this patent is extended or adjusted under 35 U.S.C. 154(b) by 286 days.

(21) Appl. No.: 16/555,557

(22) Filed: Aug. 29, 2019

(65) Prior Publication Data
US 2020/0072931 A1  Mar. 5, 2020

(30) Foreign Application Priority Data
Aug. 30, 2018 (EP) .................................. 18191698

(51) Int. Cl.
*G01R 33/56* (2006.01)
*G06N 20/10* (2019.01)
(Continued)

(52) U.S. Cl.
CPC .............. *G01R 33/56* (2013.01); *G06F 17/18* (2013.01); *G06N 3/084* (2013.01); *G06N 20/10* (2019.01);
(Continued)

(58) Field of Classification Search
CPC .............. G01R 33/56; G01R 33/56341; G01R 33/56366; G01R 33/5608;
(Continued)

(56) References Cited

U.S. PATENT DOCUMENTS 10,360,472 B2 * 7/2019 Novikov ............ G01R 33/5608
2009/0087070 A1 * 4/2009 Slabaugh ................. G06T 5/20
382/132

(Continued)

FOREIGN PATENT DOCUMENTS

WO      2017192629 A1    11/2017

OTHER PUBLICATIONS

Benou et al., "Ensemble of expert deep neural networks for spatio-temporal denoising of contrast-enhanced MRI sequences", Medical Image Analysis, vol. 42, pp. 145-159 (2017).
(Continued)

*Primary Examiner* — Michael S Osinski
(74) *Attorney, Agent, or Firm* — Caesar Rivise, PC

(57) ABSTRACT

A method of processing magnetic resonance (MR) data of a sample under investigation, includes the steps of providing the MR data being collected with an MRI scanner apparatus, and subjecting the MR data to a multi-parameter nonlinear regression procedure being based on a non-linear MR model and employing a set of input parameters, wherein the regression procedure results in creating a parameter map of model parameters of the sample, wherein the input parameters (initial values and possibly boundaries) of the regression procedure are estimated by a machine learning based estimation procedure applied to the MR data. The machine learning based estimation procedure preferably includes at least one of at least one neural network and a support vector machine. Furthermore, an MRI scanner apparatus is described.

15 Claims, 6 Drawing Sheets

(51) Int. Cl.
*G06F 17/18* (2006.01)
*G06N 3/08* (2006.01)
*G06T 5/00* (2006.01)

(52) U.S. Cl.
CPC .... *G06T 5/009* (2013.01); *G06T 2207/10088* (2013.01); *G06T 2207/20081* (2013.01); *G06T 2207/20084* (2013.01)

(58) Field of Classification Search
CPC ........ G01R 33/243–246; G01R 33/443; G01R 33/4828; G01R 33/485; G01R 33/50; G01R 33/56308; G01R 33/5635; G06N 20/10; G06N 3/084; G06N 3/0454; G06F 17/18; G06T 5/009; G06T 5/002; G06T 2207/10088; G06T 2207/20081; G06T 2207/20084; G06T 2207/10081; G06T 2207/10116; G06T 2207/10016; G06T 2207/30004; G06T 2207/30016; G06T 2207/30101; G06T 2207/30168; G06T 7/0012; A61B 5/055; A61B 5/0042; A61B 5/0035; A61B 5/4088; A61B 5/7203; A61B 5/7207; A61B 5/0263; A61B 5/4082; A61B 5/4267; A61B 5/5205; A61B 5/5211; A61B 5/5258; A61B 6/032
See application file for complete search history.

(56) References Cited

U.S. PATENT DOCUMENTS

| | | | | |
|---|---|---|---|---|
| 2012/0041685 | A1* | 2/2012 | Ding | A61B 6/032 702/19 |
| 2013/0261429 | A1* | 10/2013 | Lee | A61B 5/0035 600/411 |
| 2014/0029823 | A1* | 1/2014 | Birkbeck | G06T 7/149 382/131 |
| 2015/0196265 | A1* | 7/2015 | Suzuki | G06T 5/50 378/37 |
| 2015/0201895 | A1* | 7/2015 | Suzuki | A61B 6/5211 382/131 |
| 2016/0343129 | A1 | 11/2016 | Novikov et al. | |
| 2017/0023496 | A1* | 1/2017 | Persson | G06T 11/005 |
| 2017/0100078 | A1* | 4/2017 | Han | G01R 33/5608 |
| 2017/0103287 | A1* | 4/2017 | Han | G06K 9/46 |
| 2017/0160363 | A1* | 6/2017 | Chen | G06N 3/08 |
| 2017/0205482 | A1* | 7/2017 | Zhao | G01R 33/5608 |
| 2018/0144214 | A1* | 5/2018 | Hsieh | G06K 9/036 |
| 2018/0144466 | A1* | 5/2018 | Hsieh | G06N 3/04 |
| 2018/0196892 | A1* | 7/2018 | Viana | G06F 30/20 |
| 2018/0263569 | A1* | 9/2018 | Wang | A61B 5/7275 |
| 2018/0292492 | A1* | 10/2018 | Griswold | G01R 33/34092 |
| 2018/0321347 | A1* | 11/2018 | Wang | A61B 5/055 |
| 2018/0353099 | A1* | 12/2018 | Sutton | G06T 7/0012 |
| 2018/0365828 | A1* | 12/2018 | Mansi | G16H 30/20 |
| 2019/0353718 | A1* | 11/2019 | Griswold | A61B 5/055 |
| 2019/0353731 | A1* | 11/2019 | Liu | G01R 33/54 |
| 2020/0029925 | A1* | 1/2020 | Saillant | G06K 9/6296 |
| 2021/0156940 | A1* | 5/2021 | Sommer | G01R 33/565 |
| 2021/0225047 | A1* | 7/2021 | Pawar | G01R 33/4818 |

OTHER PUBLICATIONS

Foresee et al., "Gauss-Newton Approximation to Bayesian Learning", Proceedings of the International Joint Conference on Neural Networks, pp. 1930-1935 (1997).

Gonzalez et al., "Modeling diffusion-weighted MRI as a spatially variant Gaussian mixture: Application to image denoising", Med. Phys., vol. 38, No. 7, pp. 4350-4364 (2011).

Hu et al., Intraoperative Organ Motion Models with an Ensemble of Conditional Generative Adversarial Networks, M. Descoteaux et al. (Eds.): MICCAI 2017, Part II, LNCS 10434, pp. 368-376 (2017).

Jin et al., "MR imaging of the Amide-Proton Transfer effect and the pH-insensitive Nuclear Overhauser Effect at 9.4 T", Magn. Reson. Med., vol. 69, No. 3, pp. 760-770 (2013).

Mackay. "Bayesian interpolation." Neural computation 4.3 (1992): 415-447.

Misra et al., "Effect of using Genetic Algorithm to denoise MRI Images corrupted with Rician Noise", Emerging Trends in Computing, Communication and Nanotechnology (ICE-CCN), 2013 International Conference on IEEE, pp. 146-151 (2013).

Schuenke et al., "Simultaneous Mapping of Water Shift and B1 (WASABI)—Application to Field-Inhomogeneity Correction of CEST MRI Data", Magnetic Resonance in Medicine, vol. 77, pp. 571-580 (2017).

Windschuh et al., "Correction of B1-inhomogeneities for relaxation-compensated CEST imaging at 7T", NMR Biomed., vol. 28, pp. 529-537 (2015).

Zaiss et al., "Relaxation-compensated CEST-MRI of the human brain at 7T: Unbiased insighed into NOE and amide signal changes in human glioblastoma", Neuroimage, vol. 112, pp. 180-188 (2015).

Zaiss et al. "snapCEST—A single-shot 3D CEST sequence for motion corrected CEST MRI" Poster presented at 25th Annual Meeting and Exhibition of the International Society for Magnetic Resonance in Medicine (ISMRM 2017), Honolulu, HI, USA.

Zhou et al., "Quantitative chemcial exchange saturation transfer (CEST) MRI of glioma using Image Downsampling Expedited Adaptive Least-squares (IDEAL) fitting", Scientific Reports, vol. 7, No. 84, pp. 1-10 (2017).

* cited by examiner

METHOD AND APPARATUS FOR PROCESSING MAGNETIC RESONANCE DATA

FIELD OF THE INVENTION

The invention relates to a method and to an apparatus for processing magnetic resonance (MR) data of a sample under investigation, e.g., a model solution, a biological organism, like a patient or a test person, or a part thereof. Preferably, the processing of MR data is included in a magnetic resonance tomography (MRT) procedure for investigating the sample under investigation. Applications of the invention are available e.g., in the fields of medical imaging or material investigations.

TECHNICAL BACKGROUND

In the present specification, reference is made to the following prior art illustrating technical background of the invention and related techniques:
[1] T. Jin et al. in "Mag Reson Med" (2013) 69:760-770;
[2] M. Zaiss et al. in "NMR in Biomed" (2013) 26:1815-1822;
[3] I. Y. Zhou et al. in "Scientific Reports" (2017) 7:84;
[4] US 2017/0160363 A1;
[5] WO 2017/192629 A1;
[6] D. J. C. MacKay in "Neural computation" Vol. 4, No. 3, 1992, pp. 415-447;
[7] F. D Foresee et al. in "Proceedings of the International Joint Conference on Neural Networks", June 1997, pp 1930-1935;
[8] M. Zaiss et al. in "Proc. ISMRM" 2017, p. 3768;
[9] J. Windschuh et al. in "NMR in Biomed" 2015 28:529-537; and
[10] P. Schuenke et al. in "Magnetic Resonance in Medicine". 2017; 77(2):571-580.

In MR techniques, MR data being collected with a magnetic resonance imaging (MRI) scanner or an MR spectrometer are subjected to a data processing for obtaining an image of the sample under investigation. The data processing employs the relationship of the MR data to the properties of the sample and the nuclear magnetic resonance (NMR) signals used by the MRI scanner. The relationship often used is represented by model equations, in particular so-called Bloch equations or equations based on these equations. For obtaining a quantitative MR image, the data processing includes a numerical or analytical solution of the Bloch equations. The solution includes a regression procedure being applied to the MR data, wherein the regression procedure starts with a set of input or starting parameters and results in a parameter map of model parameters of the sample (e.g., so called model based fitting).

Depending on the complexity of the MR technique and the sample parameters to be obtained, the regression procedure may comprise a linear or a non-linear procedure. When linear regression can be used for Bloch parameter estimation, no initial values are required and fits are relatively robust, in particular in MR imaging of biological tissue, e.g. mono-exponential parameter estimation (T1, T2) or flip angle methods (double angle or the like). However, many detailed Bloch-fits are intrinsically non-linear, e.g. multi-exponential decays, non-linear sequence signal equations (steady-state free precession (SSFP), etc.), Z-spectra and magnetization transfer (MT) effects, b-values in diffusion, or kinetic models in dynamic contrast enhancement. Estimating suitable starting parameters (also including boundaries) required by multi-parameter nonlinear Bloch-fits is challenging.

In particular in biological tissues, estimating starting parameters is a relatively complex task as different tissue, local B0 and B1 fields can lead to different initial conditions. It is not only time consuming to find appropriate starting parameters with conventional methods, but poor initial parameters can even lead to completely wrong parameter estimations.

The nonlinear regression procedure may comprise e.g., multi-Lorentzian fitting (representing the MR data by a superposition of multiple Lorentzian shaped functions) that is useful because it allows for analysis of e.g., separate chemical exchange saturation transfer (CEST) effects, such as those sensitive to pH [1] and protein folding [2]. However, due to the large number of parameters, stable results from non-linear least squares fitting require careful consideration of boundary and initial conditions, especially for low signal-to noise (SNR) data which is typically acquired at clinical field strengths. In particular in medical imaging, this can result in artefacts and misinterpretations of quantitative images, e.g. in body imaging very different tissues are in the same image leading to very different optimal initial conditions of non-linear model fits. One known approach to improving initial conditions is to iterate between downsampling (to improve SNR) and fitting [3]. This approach improves the stability of the fit, but provides only 23% reduction in computing time and must be performed for each subject.

As an alternative to the application of regression procedures, machine learning techniques, e.g. neural networks (NNs) are used in processing MR data (see e.g., [4]) or MR images (see e.g., [5]). The conventional application of NNs in processing MR data can be understood as a classification of the MR data collected with the MR acquisition apparatus. The NN is trained with a dictionary of a plurality of MR data and related parameter maps of reference samples. Applying the trained NN on the MR data of an unknown sample directly results in the quantitative MR parameter or parameter map thereof. Advantageously, the NN application is relatively fast, and starting parameters are not required.

However, the MR image obtained with the NN represents a specific image (like a property associated to the sample-"fingerprint"), which, unlike the result of the regression procedures, is not based directly on a model or any analytical equation. Especially no model based and gradient of the model based goodness-of-fit parameter can be given. This represents a substantial disadvantage of the conventional application of NNs as the NN works like a "black-box", which does not allow an evaluation of the MR image, e.g., in terms of analyzing the effect of variations of the collected MR data, identifying artefacts, and/or identifying the origins of certain image properties or sample features.

Objective of the Invention

It is an objective of the invention to provide an improved method of processing MR data, being capable of avoiding limitations and disadvantages of conventional techniques. In particular, the method is to be capable of processing MR data based on a non-linear regression procedure with reduced processing time, facilitated provision of appropriate starting parameters of the regression, reduced risk of using wrong starting parameters and/or reduced imaging artefacts. It is a further objective of the invention to provide an improved MRI scanner apparatus, being adapted for processing collected MR data and being capable of avoiding limitations and disadvantages of conventional techniques. In particular, the MR scanner apparatus is to be capable of accelerating the creation of parameter maps of a sample and/or reducing imaging artefacts.

SUMMARY OF THE INVENTION

These objectives are respectively solved by a method and an MRI scanner apparatus of the invention.

According to a first general aspect of the invention, the above objective is solved by a method of processing MR data of a sample under investigation, wherein the MR data are subjected to a multi-parameter nonlinear regression procedure (regression analysis). Preferably, the MR data comprise at least two phase and/or magnitude images and/or MRI raw data being collected with an MRI scanner (MRI scanner signal acquisition device). The regression procedure uses a non-linear MRI model with multiple model parameters. Applying the regression procedure includes identifying the model parameters such that the non-linear MRI model represents the real MR data. As the result of the regression procedure, the model parameters represent a quantitative parameter map of the sample under investigation, and in particular goodness-of-fit parameters can be generated. Depending on the MR data, the parameter map comprises an image map (MR image) and/or a map (2D or 3D locally resolved distribution) of any other sample features, like e.g., a map of T1 and T2 relaxation times representing compartments of different tissue in a biological sample.

According to the invention, input parameters of the regression procedure are estimated by a machine learning based estimation procedure applied to the MR data. The term "regression procedure" preferably includes a model function describing the MR data, including analytical models derived from Bloch equations, models based on numerical solution of Bloch equations, models based on adapted Bloch equations, in particular Bloch-McConnell equations, Bloch-Torrey equations, and/or Bloch-Solomon equations, a magnetic field mapping model and a T1 and T2 relaxation times estimating model, or combinations thereof. The term "input parameters" refers to any input data (starting values, possibly boundaries) being employed by the regression procedure in an initial iteration step. The term "machine learning based estimation procedure" refers to any method (algorithm) processing the MR data, that is trained with training data (here: a plurality of known MR data and associated input parameters of regression procedures) and that outputs prediction values (here: input parameters of regression procedures for processing the MR data under investigation). The MR data are subjected to the machine learning based estimation procedure preferably in a pixel-wise manner, i. e. 3+N-dimensional MR data being collected with an MRI scanner is divided into voxel data containing the N-dimensional MR data and each voxel's data is input to the estimation procedure (N referring to one or more further sample features optionally collected with the MRI scanner).

The inventive MR data processing can be conducted immediately after collecting the MR data, e.g., by the MRI scanner apparatus used for collecting the MR data, i. e. it is included in the MR examination process. In particular, the step of estimating the input parameters can be included in an image reconstruction procedure conducted by the MRI scanner apparatus. Alternatively or additionally, the inventive MR data processing can be conducted offline with pre-stored collected MR data, e.g., for a post-processing of available MR data. With the latter embodiment, in particular the step of estimating the input parameters can be conducted separately from the operation of the MRI scanner apparatus. MR data collected in the past can be subjected to a further analysis, e.g., for obtaining additional mapping information on the sample.

According to a second general aspect of the invention, the above objective is solved by an MRI scanner apparatus, comprising an MRI scanner for collecting MR data and a data processing unit for subjecting the MR data to a multi-parameter nonlinear regression procedure based on a non-linear MR model. The MRI scanner comprises any scanner apparatus which is configured for MRT based (in particular spectroscopic) imaging a sample under investigation, e.g. any available MRI scanner. The data processing unit, which comprises e.g., a computer running a software, is configured for creating a parameter map of model parameters of the sample by the regression procedure, using a set of input parameters of the regression procedure.

According to the invention, the data processing unit includes an estimator section for estimating the input parameters of the regression procedure by applying a machine learning based estimation procedure on the MR data. Preferably, the data processing unit is adapted for conducting the method of processing MR data according to the first general aspect of the invention.

According to both general aspects of the invention, processing the MR data comprises two steps, including the machine learning based estimation procedure as a first step and the subsequent regression procedure as a second step. A main advantage of the invention results from the machine learning algorithm enabled non-linear input parameter estimation from the MR data. The input parameters obtained by machine learning allow a fast and reliable parameter mapping by the regression procedure, realized on the MRI scanner or offline.

Furthermore, the machine learning based estimation procedure provides the input parameters of the regression procedure only, but not the final parameter map. This is in contrast to conventional NN based MR imaging. While the final result of the conventional MR imaging depends on the "black-box" NN, the model based regression procedure of the invention introduces a dependency on the model representing the sample. Thus, if the machine learning based estimation procedure would provide non-realistic input parameters, this would be immediately recognized with the application of the regression procedure, e.g., by goodness-of-fit parameters, resulting in an improved artefact suppression by the invention. Advantageously, the regression procedure provides an inherent verification of the input parameters predicted by the machine learning based estimation procedure. Alternatively, with a machine learning based estimation procedure being trained with sufficient stability and reliability, a non-realistic construction of a model can be identified, on which the regression procedure is based.

Advantageously, various types of machine learning based estimation procedures are available. According to a first variant, the machine learning based estimation procedure comprises at least one neural network (artificial neural network, ANN), including e.g., a deep learning network and/or a recurrent NN (so called LSTM for Long short-term memory), and/or a convolutional neural network (CNN). The NNs may have advantages in terms of easy software implementation. In particular, the CNN may have advantages in terms of identifying local information in MR data and using translation invariances of modeled data, LSTM have the benefit of faster and more efficient training. As the application of the trained NN may include matrix multiplications and elementary functions only, the NN based estimation procedure can be implemented with any available programming computer language and on typical personal computer level hardware. According to a second variant, the machine learning based estimation procedure comprises a support vector machine (SVM). The SVM may have advantages as they require less memory for storing the model, and analysis of the SVM can be more insightful compared to neural networks. The invention is not restricted to these algorithms. Other estimation procedures can be used as well, based on e.g., the k-means algorithm, the auto encoder algorithm, decision tree algorithms or the maximum likelihood algorithm.

As a further advantage, various sources of data for training the machine learning based estimation procedures are available. In particular, the estimation procedure can be trained by at least one of Bloch equation simulation data, real data and manipulated real data. Advantageously, a large number of simulation data can be created by simulating phantom samples and appropriate input parameters for training the estimation procedure. Using real data and/or manipulated real data may have advantages for artefact suppression.

According to a particularly preferred embodiment of the invention, the input parameters of the regression procedure can be estimated by using a combination of an estimation procedure being trained by simulation data, an estimation procedure being trained by real data, and an estimation procedure being trained by real but manipulated data. That way, the estimator is both close to the theory, as well as robust against noise and other measurement fluctuations.

According to a preferred embodiment of the invention, the machine learning based estimation procedure of 3+N dimensional MR data is applied on N-dimensional MR data of pixels (voxels) of the sample under investigation separately. This is in contrast to conventional applications of NNs in processing complete MR images.

According to a further advantageous embodiment of the invention, the regression procedure may include one single iteration step for creating the parameter map of model parameters from the input parameters. Advantageously, the input parameters predicted by the machine learning based estimation procedure may be sufficiently matched to the parameter map to be obtained. The single iteration step is sufficient for fulfilling the above verification function of the regression procedure. Furthermore, conducting only one single iteration step accelerates the procedure, while goodness-of-fit parameters can still be generated.

Another particular advantage of the invention may result if the steps of estimating the input parameters and subjecting the MR data to the multi-parameter nonlinear regression procedure are repeated at least once, wherein a changed configuration of the machine learning based estimation procedure is used with each repetition. Changing the configuration of the estimation procedure may comprise e.g. changing the number of neurons and/or layers and/or introducing activation functions to at least a group of neurons. The repetitions can be conducted until the parameter map of the model parameters provides a realistic approximation of the sample, i. e. a sample map which is matched to a map expected e.g., from reference data or other imaging methods applied.

Preferably, the non-linear MR model of the regression procedure comprises at least one of a Bloch equation based MR model, a magnetic field mapping model and a T1 and T2 relaxation times estimating model. Advantageously, the invention provides parameter maps in particular with regard to these models in an essentially accelerated manner, e.g. as shown in the examples below.

Advantageously, multiple applications of the invention are available. With preferred examples, the parameter map of the sample created by the regression procedure comprises at least one of an exponential T1, T2 map, a multi-exponential T1, T2 map, a T1 and T2 spectroscopy map, spectroscopic imaging map, metabolite concentration and relaxation parameter map, a compartmental map of parameters, e.g., fat-water parameters, or pharmacokinetic parameters, an apparent diffusion coefficient (ADC)-map for varying B-values, a Kurtosis parameter map, a parameter map of perfusion and dynamic contrast enhanced imaging, in particular including modelling of input function, glucose, GAG (glycosaminoglycans), and 3-oyxmethylglucose (3-OMG), a parameter map of CEST imaging, in particular including Z-spectra modelled by Multi-Lorentzian regression, or Henkelman-based water, MT and CEST pool regression, a field parameter map (B1, B0), in particular including Bloch-Siegert shift based B1 mapping, multi-flip angle mapping, DREAM (Dual Refocusing Echo Acquisition Method) pulse sequence or WASABI (WAter Shift And B1), and a parameter map representing motion, breathing and/or pulsation with known non-linear influence.

BRIEF DESCRIPTION OF THE DRAWINGS

Further advantages and details of the invention are described in the following with reference to the attached drawings, which schematically show in.

DETAILED DESCRIPTION OF PREFERRED EMBODIMENTS OF THE INVENTION

Embodiments of the invention are described in the following with particular reference to the combination of the machine learning based estimation procedure with the regression procedure. The invention preferably is implemented with an MRI scanner as it is known per se. Accordingly, details of the MRI scanner, the available control schemes thereof, available excitations and read-out sequences, available schemes of MR signal acquisition and types of MR data are not described as they are known per se from prior art.

Embodiments of the MR Data Processing Method and MRI Scanner Apparatus

Figure 1:
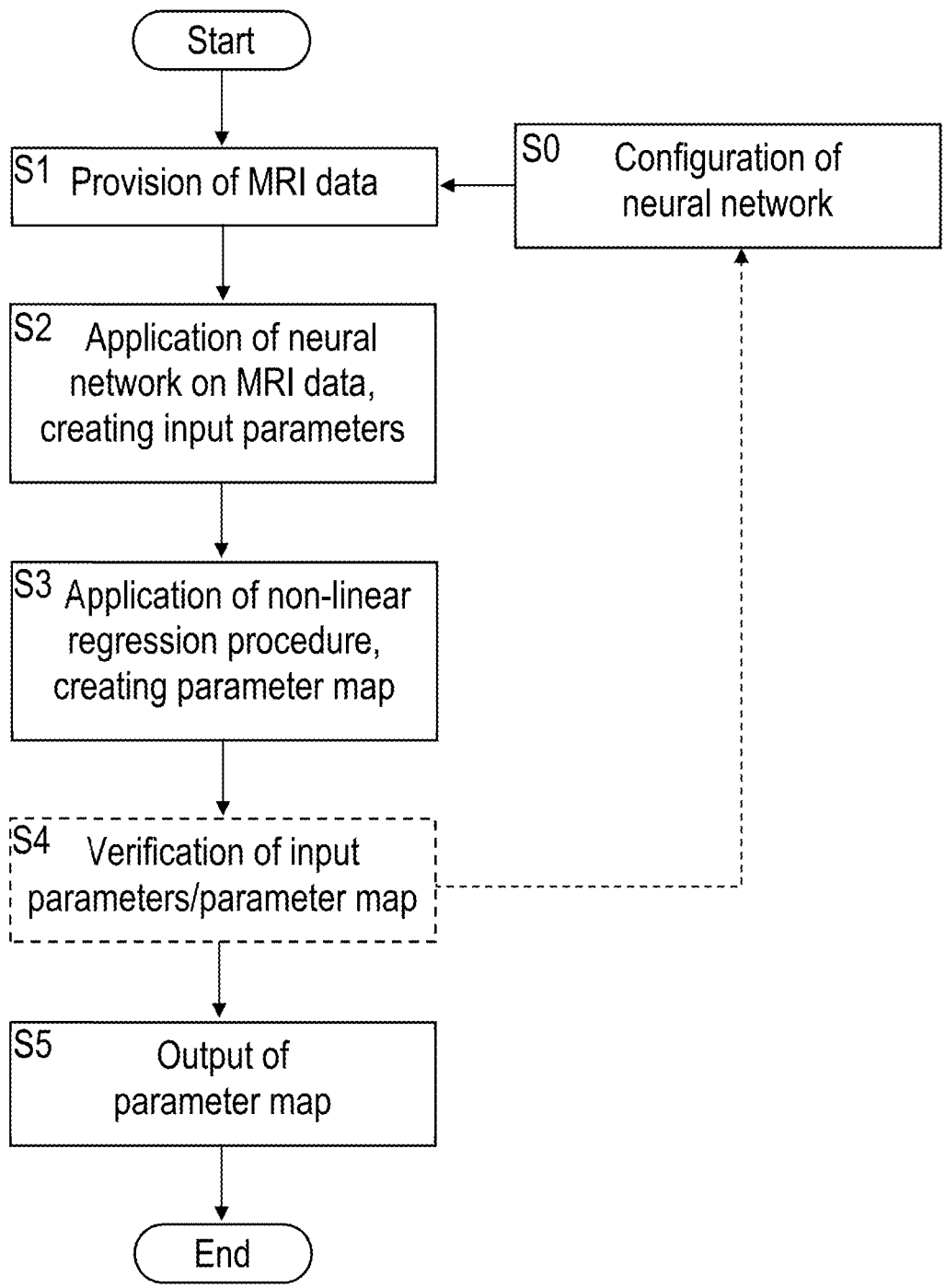
FIG. 1: a flowchart illustrating features of preferred embodiments of the inventive method of processing MR data.

FIG. 1 schematically illustrates an embodiment of the MR data processing method using a NN (see e.g., FIG. 3) as an example of a machine learning based estimation procedure applied for providing input parameters of the regression procedure. Alternatively or additionally, a SVM algorithm or any other estimator trained with MRI simulation or real data can be applied.

The MR data processing method includes a configuration step S0, wherein the NN is configured. Configuration of the NN includes providing the NN architecture, in particular selecting a number of neurons, a number of layers. With a practical example, 400 neurons and 3 layers are provided. Additionally, the configuration of the NN can include selecting or adapting a regression model and an associated NN architecture, e.g. as a result of step S4 (see below). Furthermore, the configuration of the NN in step S0 includes training the NN (see FIG. 5). Step S0 is conducted once, or it is optionally repeated e.g. after step S4 (see below).

The main process starts with step S1 of providing the MR data, e.g. by a running MRI scanner operation. The MR data are stored in an MR data storage of the MRI scanner apparatus or any other computer setup. With an example, the MR data comprise raw data collected with the application of a read-out sequence with the MRI scanner, like e.g., spin-echo, gradient echo, bSSFP (balanced steady-state free precession), EPI (echo planar imaging) and/or any magnetization-prepared readout, e.g., CEST, T1p, MP-RAGE (magnetization-prepared rapid gradient echo), diffusion-weighted. Also spectroscopic imaging data is possible to be evaluated, like MRSI (MR spectroscopic imaging) data, CSI (chemical shift imaging) data, or EPSI (echo planar spectroscopic imaging) data.

Subsequently, the NN is applied to the MR data for creating input parameters with step S2. As the result of step S2, the input parameters for the subsequent regression procedure are provided, e.g. as a vector or any other data format of initial values.

The input parameters are employed as starting values in the non-linear regression procedure conducted in step S3. The regression procedure comprises an available non-linear regression, like e.g. a least squares optimization (e.g. Levenberg-Marquardt-algorithm, Levmar) or a Markov chain Monte Carlo (MCMC) simulation or a Bayesian nonlinear regression or Maximum-Likelihood methods. As the result, a parameter map of the sample is created, which is output in step S5, e.g. for consideration by a user, further analysis, subsequent separate diagnostic steps and/or post-processing.

Optionally, a verification step S4 can be included, wherein the input parameters and/or the parameter map are verified, e.g. by comparing with reference data or by applying test routines analyzing mapping details. As a result of the verification step S4, if the input parameters and/or the parameter map do not provide a realistic representation of the sample, the configuration of the NN can be changed, e.g., by changing the network architecture, or even the regression procedure can be changed, e.g., from 3-exponential fitting to 4-exponential fitting.

Figure 2:
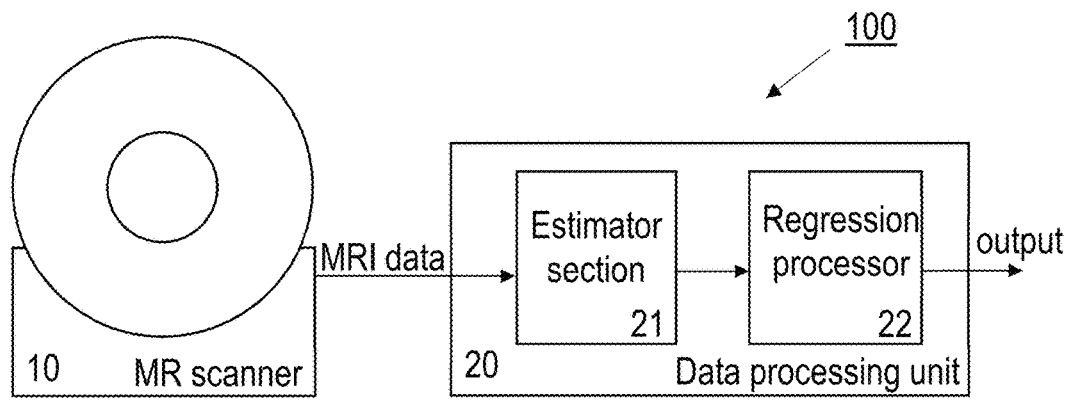
FIG. 2: a schematic illustration of features of preferred embodiments of the inventive MRI scanner apparatus.

FIG. 2 shows an example of an MRI scanner apparatus 100, which comprises an MRI scanner 10 (image data acquisition unit) and a data processing unit 20 (image reconstruction unit) with an estimator section 21 and a regression processor 22. The data processing unit 20 comprises at least one computer circuit (hardware chip) being included in or coupled with the MRI scanner 10. Details of operating the data processing unit 20, in particular for the configuration of the NN, are implemented as known from conventional computer circuits (not shown in FIG. 2).

MR data are collected with the MRI scanner 10. The raw data can be subjected to a Fourier transformation (in particular FFT) for generating a series of MR data in a FFT section (not shown) of the MRI scanner 10 (MRI scanner signal acquisition device 10) or the data processing unit 20. The inventive neural network enabled non-linear parameter estimator section 21 is part of the data processing unit 20 (or alternatively part of the MRI scanner 10). From a series of at least two phase/magnitude images (and/or also from raw data directly) it provides best starting values and boundaries for a subsequent non-linear fit by the regression processor 22, which then creates the reliable quantitative parameter maps.

Figure 3:
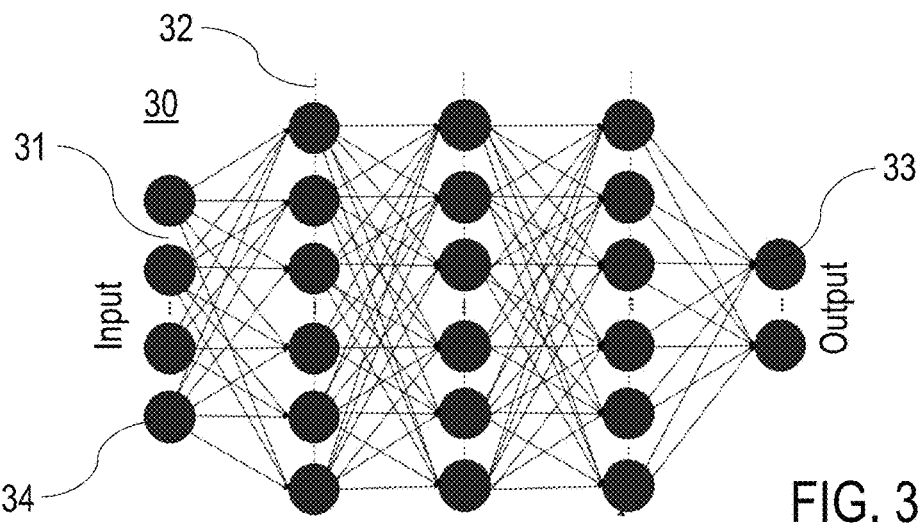
FIGS. 3 and 4: schematic illustrations of machine learning based estimation procedures employed with preferred embodiments of the invention.
Figure 4:
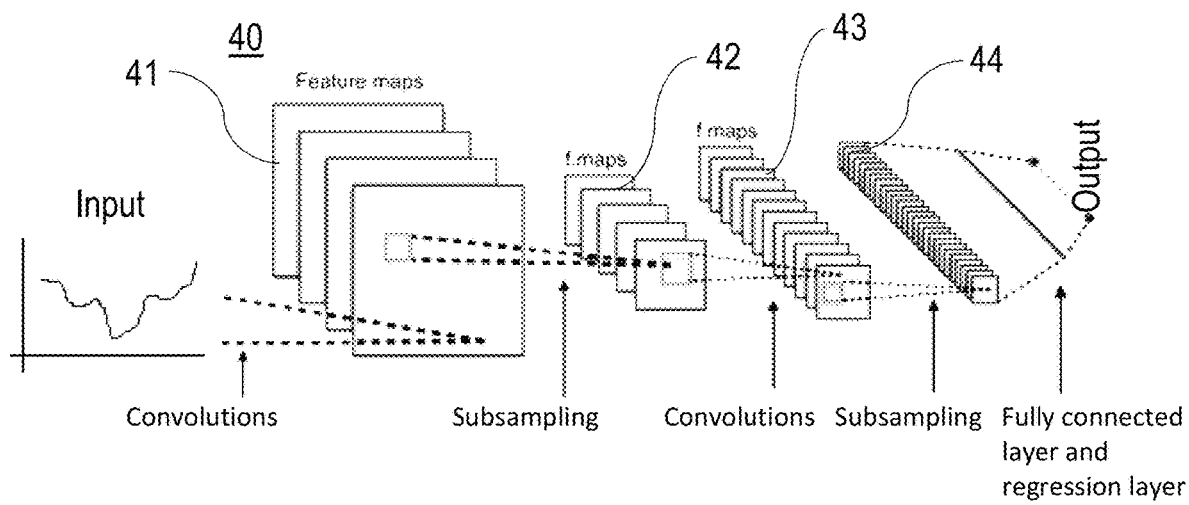

As shown in FIGS. 3 and 4, the machine learning based estimation procedure can be realized e.g., by an artificial neural network 30 (ANN or perceptron, FIG. 3) or a convolutional neural network 40 (CNN or autoencoder, FIG. 3). Generally, the employed network is defined as a network where the input data is a vector of MR voxel data and the output is a vector of parameters of the underlying fit model.

ANN 30 comprises an input layer 31, at least one hidden layer 32 and an output layer 33, each with a number of neurons 34. The number of neurons (nodes) and layers is adapted to the specific data that is used. An exemplary ANN 30 based functioning network can be achieved using 400 neurons 34 and 3 layers 31, 32, 33; given by [100 200 100] where this notation stands for [(neurons in input layer 31) (neurons in hidden layer 32) (neurons in output layer 33)]. Other depths and widths of the can be used as well. In a practical example, 3 T Z spectra data are input at the input layer 31, and 9.4 T Lorentzian fit parameters are output at the input layer 33. With the same architecture as ANN also LSTM network nodes can be used to realize an LSTM based estimator.

An exemplary CNN 40 can be built as in FIG. 4 of an input layer 41 of size of the input data (53 here), a 53×1 convolution layer 42 with 100 convolution filters, a 27×1 convolution layer 43 with 200 convolution filters, a 14×1 convolutional layer 44, and a fully connected layer with subsequent output regression layer. When using CNNs, neighboring voxels can be included for the estimation of parameters underlying a single voxels. Advantageously, this can improve the estimation in cases of low SNR data. This would change the input layer to 3×3×10 for example. Also an autoencoder architecture (not shown) can be used that consists of an input layer, a 10×1 convolution layer with 32 convolution filters, a ReLU layer, pooling layer, a 10×1 convolution layer with 32 convolution filters, a ReLU layer, pooling layer, deconvolution layer, ReLU, deconvolution layer, ReLU, Convolution and regression output layer.

Figure 5:
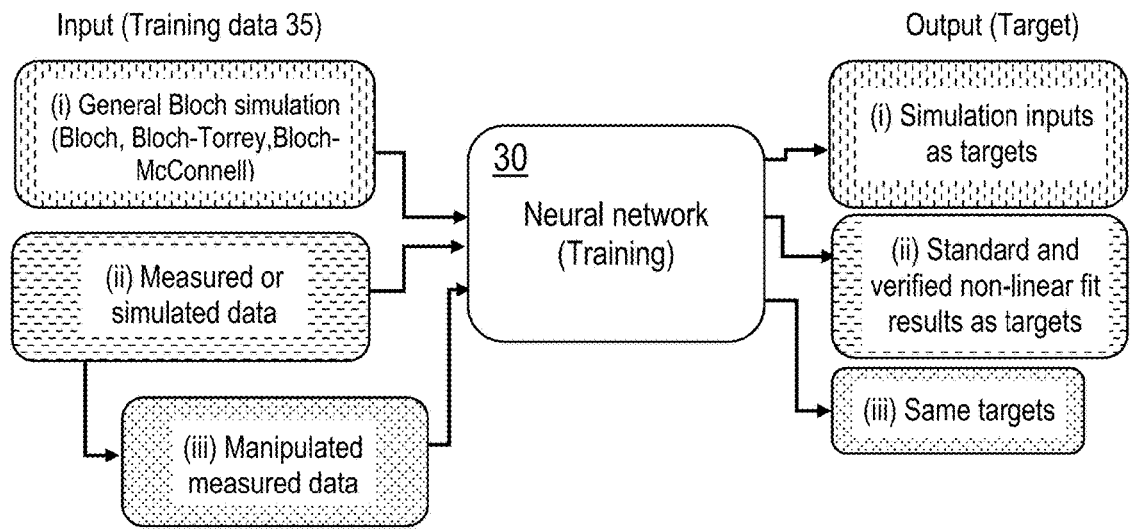
FIG. 5: a schematic illustration of training a machine learning based estimation procedure.

FIG. 5 schematically illustrates variants of creating the trained NN 30. The training (learning) of the neural network 30 (e.g., in step S0, see FIG. 1) for the actual problem uses training data, including at least one of (i) training data being provided by the underlying Bloch equations, or derivate of Bloch equations, including e.g., diffusion, chemical exchange, flow, pharmacological kinetics, etc., wherein simulation parameters are used as targets 36 and simulated data are used as inputs 35 for the NN training, (ii) training data being provided by real acquired data as inputs 35 and corresponding classical estimations of the parameter maps as targets 36 (as an example, a single volunteer can be used for training as this is a voxel based approach, so a 3D dataset already provides a large amount of data of input data with easily 200 000 elements), and (iii) any variations of the input data 35 of (ii), including real acquired data with added noise, motion and/or fluctuations) with the same targets 36 as in (ii).

The training process is a so-called back-propagation optimization (e.g. scaled conjugate gradient backpropagation, Bayesian regularization backpropagation ([6], [7]), or others) of the free para-meters of the network using input vectors and target parameter vectors of a training dataset.

The starting point of the optimization uses randomly initialized matrices. To avoid overfitting, at least one of the following strategies is preferred. The first is an early stopping procedure, wherein the training data is randomly divided into a training set (70%), a validation set (15%) and a test set (15%), and the validation set is used to determine an early stopping criteria: if the rmse (root mean squared error value) of the validation data does not improve within 5 iterations, the optimization is stopped. The second method is a regularization procedure, which uses a regularization factor $\gamma$ to add a penalty to large weights and thus avoid overfitting. If mse is the mean-squared-error of the optimization and msw are the mean-squared-weights then the optimized function with regularization is msereg=$\gamma$*msw+(1-$\gamma$)*mse. As an example, in the final network training $\gamma$ was set to 0.5, but other values are possible depending on the data.

APPLICATION EXAMPLES

1. Z-Spectrum Fitting in CEST Experiments

Figure 6:
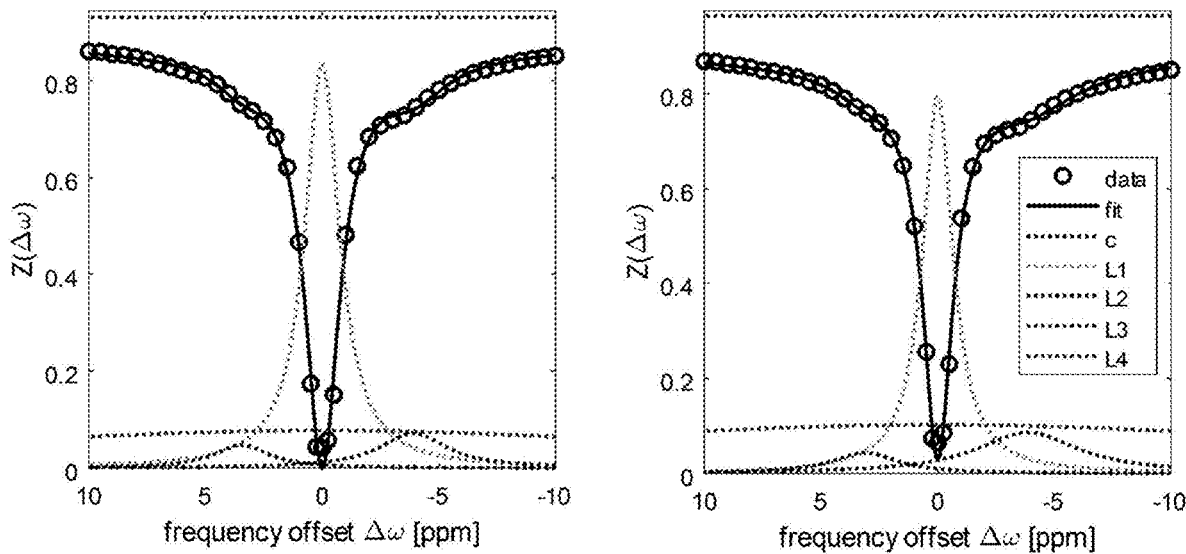
FIGS. 6 to 11: illustrations of results obtained with exemplary applications of the invention.
Figure 7:
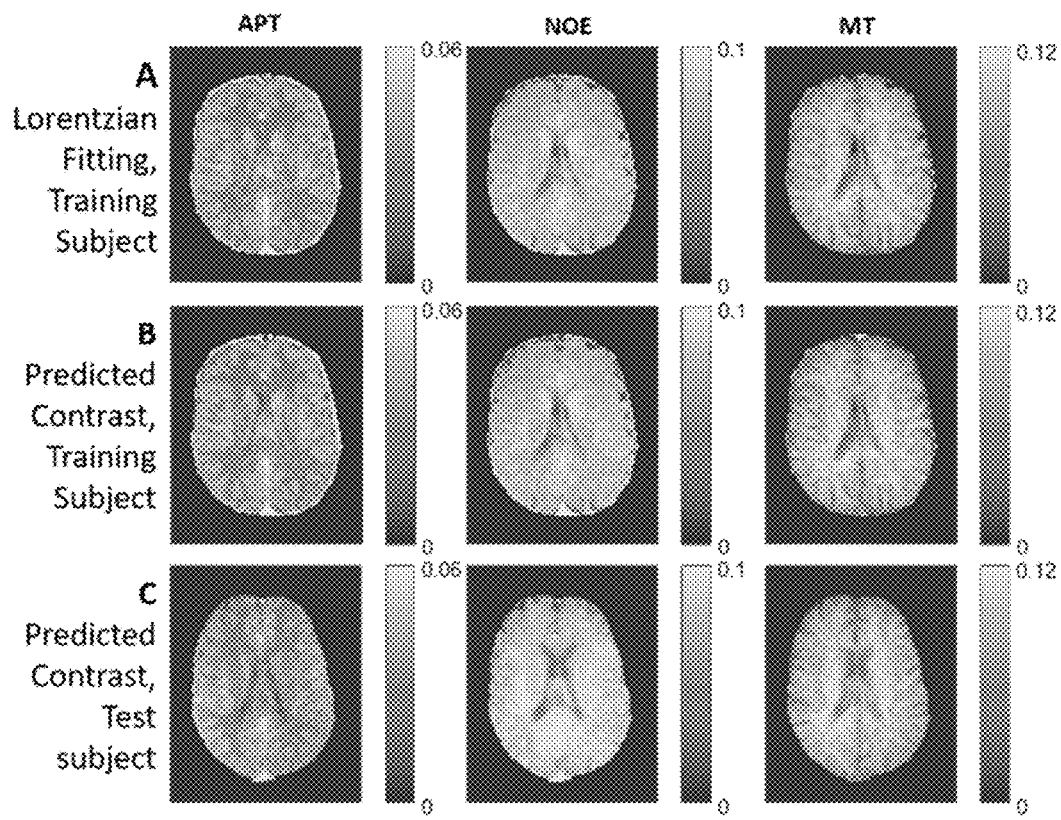
Figure 8:
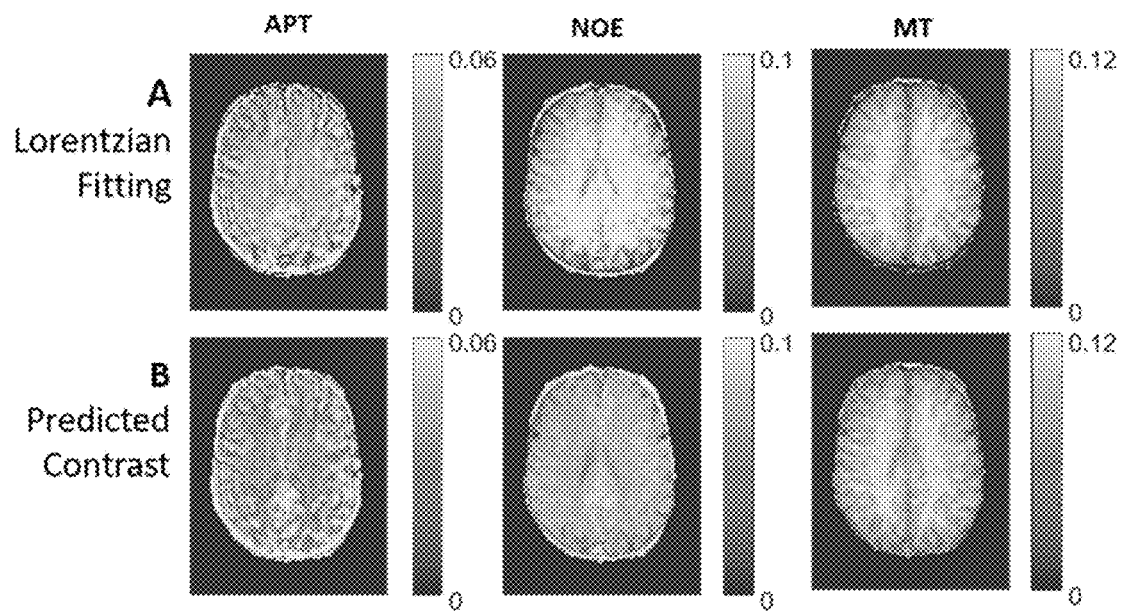

Multi-Lorentzian fitting is described as a first example of a multi-parameter nonlinear regression procedure, where NNs can be used for creating regression input parameters (see FIGS. 6 to 8). Furthermore, the inventors have demonstrated that a NN trained in one subject can be successfully applied to estimate CEST pool parameters in another subject.

MR data including CEST contrast information were acquired with the MRI scanner apparatus 100 of FIG. 2 in a snapshot CEST operation mode with a centric reordered gradient-echo sequence (3D coverage, 1.7×1.7×3 mm resolution, 18 slices, 6 min 35 sec) at B0=3 T [8]. Presaturation (4 s) consisted of 100 Gaussian inversion pulses (tp=20.48 ms, td=20 ms, B1=0.6 µT) applied at 54 offsets from −100 ppm to 100 ppm with adaptive sampling (higher between +/−10 ppm). Protein CEST data were acquired at 3 T in heads of 3 healthy subjects (MRI scanner: Siemens Prisma) with 64 channel head coil and in 1 brain tumor patient (Siemens Verio PET/MR) with 18 channel head coil. Gray matter, white matter, and cerebrospinal fluid voxels were isolated by manual segmentation. CEST images were generated from the Z-spectrum $Z(\Delta\omega)$, given by the ratio of the saturated image $S_{sat}(\Delta\omega)$ and the fully relaxed image $S_0$ according to equation (1):

$$Z(\Delta\omega) = \frac{S_{sat}(\Delta\omega)}{S_0} \quad (1)$$

To isolate CEST effects in the Z-spectra (input MM CEST data: circles in FIG. 6) were fitted pixel-wise with a 4-pool Lorentzian model [9] of background signal, direct water saturation, semisolid magnetization transfer (MT), amide (APT), and NOE pools.

$$Z(\Delta\omega)=c-L1-L2-L3-L4 \quad (2)$$

with each $L_x$ being a Lorentzian function defined by $$L_x = A_x \frac{\Gamma_x^2/4}{\Gamma_x^2/4 + (\Delta\omega - \delta_x)^2} \quad (3)$$

Dashed lines in FIG. 6 represent the individual Lorentzian functions L1 to L4 defined by the parameters of each Lorentzian line (this parameter vector defines the output or target data in each pixel).

Noisy Z-spectra from 3 slices in different brain regions were then used as an input for a 3-layer deep neural network (NN, 400 neurons in total) with the Lorentzian pool parameters fitted from de-noised Z-spectra as target values. Validation was performed by comparing the predicted Lorentzian pool amplitudes to those fitted from de-noised Z-spectra. The dataset was divided randomly into training (70%), validation (15%), and test sets (15%) to avoid overfitting. Trained with about 3000 iterations, the neural network was applied to noisy Z-spectra from other slices in the same volunteer, as well as to data from two additional healthy subjects.

Lorentzian least squares fitting of de-noised, 3D Z-spectra takes approx. 6.5 minutes for 14 slices using parallel computation. FIG. 6 shows the Lorentzian fit (solid black line) for gray brain matter (GM) pixel (left) and white brain matter (WM) pixel (right). Training the NN on 3 slices from a single subject took 5.8 minutes, but applying the NN to predict Lorentzian parameters in 14 slices takes only 2 seconds. FIG. 7 compares quantitative CEST maps (Lorentzian pool amplitudes) in a representative test slice from least squares fitting (FIG. 7A) and the NN prediction (FIG. 7B) in the training subject and a test subject. This slice was not included in the training dataset. The predicted contrasts have the same amplitude and follow the same spatial distribution of tissues as the least squares fitting results, and similar results are seen in untrained data from the test subject. Applying the neural network to a test subject (FIG. 7C) yields consistent features and contrast. Thus, the inventive NN prediction of input parameters performed on noisy data maintains the spatial smoothness of the pixel-wise fit performed on de-noised data.

FIG. 8 shows CEST maps from Lorentzian pool analysis by least squares fitting (FIG. 8A) and neural network prediction (FIG. 8B) in a second test subject with motion corrupted data (motion during the scan). CEST maps from least squares fitting exhibit artifacts, disrupted gray matter/white matter contrast in APT, and elevated signal in all pools. However, the NN prediction is robust to motion errors, with the pool sizes similar to those in FIG. 1 and the expected contrasts in healthy tissues.

The example of FIGS. 6 to 8 shows that the NN can be trained and applied to rapidly predict CEST pool parameters pixelwise form Z-spectrum data. A NN powered fit with a single iteration would need 2 s for a 3D stack while a full non-linear fitting takes about 6.5 minutes; this is an improvement by a factor 195. Parameter fitting enabled by NNs provides a fast estimation of initial conditions in each pixel and thus a mechanism for fast online calculation of quantitative CEST images. Furthermore robustness against local minima introduced by motion artifacts in the data is obtained.

2. B0 and B1 Mapping—WASABI

Figure 9:
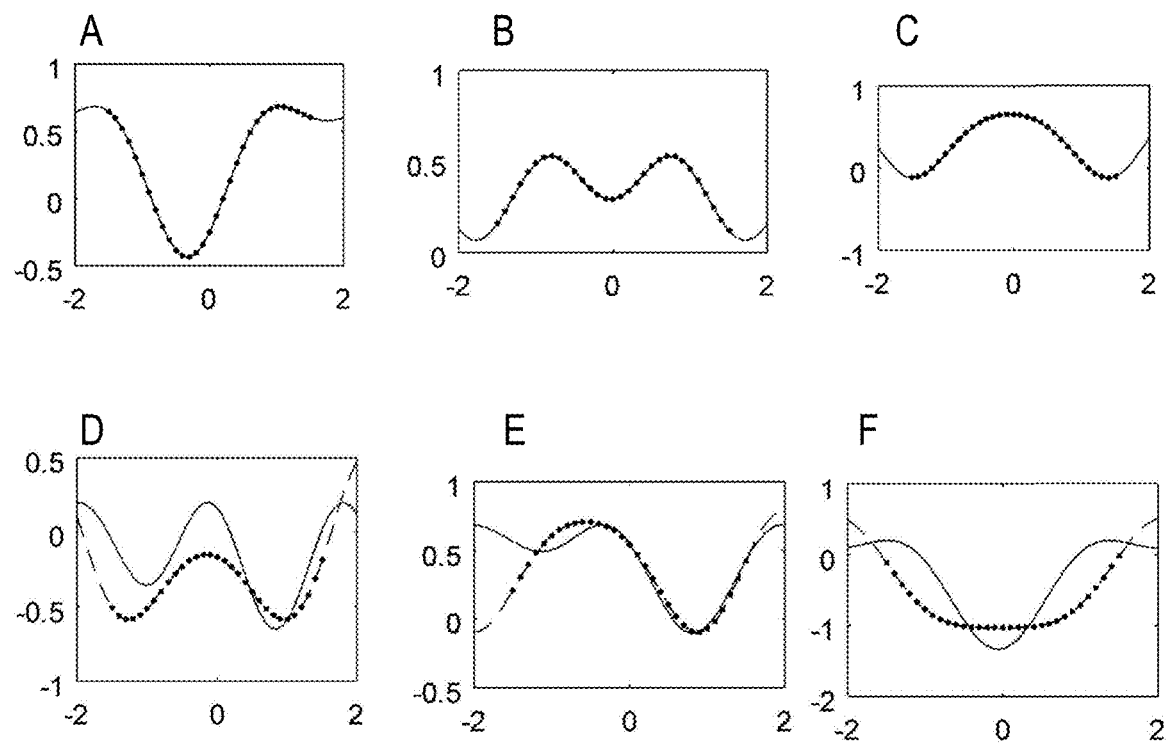
Figure 10:
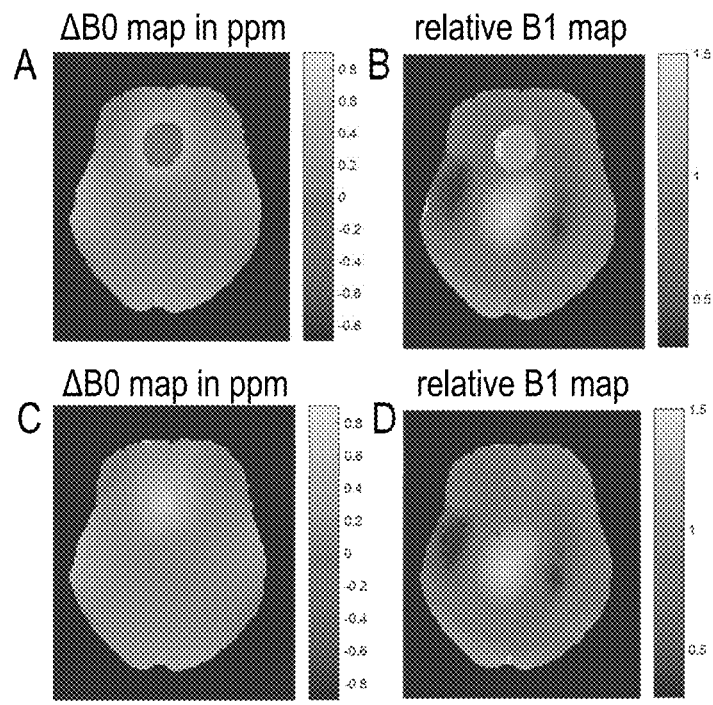

B0 and B1 mapping is described as a second example of the inventive MR data processing (see FIGS. 9 to 10). The static (B0) and radiofrequency field (B1) can be measured using the off-resonant Rabi-Oscillations induced by a short rectangular pulse. The MR sequence used here with the MRI scanner apparatus 100 consists of e.g. a short rectangular pulse followed by a fast MR readout. For preparation, a block pulse with tp=3.7 ms and nominal B1=5 µT (flip angle=284°) was employed. Sampling of 32 offsets was performed equidistantly between −1.5 ppm and 1.5 ppm.

However, the equation describing the outcome is highly non-linear leading to regional local minima in the B0 and B1 mapping of brain data at ultra-high field, where field inhomogeneities are strong. The inventors have found that for WASABI B0 and B1 inhomogeneity mapping the non-linear fitting can be strongly improved using the invention, not only for avoiding local minima, but also in reduced fitting time. It is noted that the off resonance measurement mentioned here is very similar to the bSSFP profile and the same advantageous result can be obtained by fitting of bSSFP profiles.

With more details, according to [10] (see also textbooks on physical principles and sequence design in MRI) the Z-magnetization after the rectangular pulse is given by $$Z(\Delta\omega) = \qquad (4)$$
$$af \cdot \left\| c - 2 \cdot \sin^2\left(\tan^{-1}\left(\frac{\gamma \cdot B_1}{\Delta\omega - \delta\omega_a}\right)\right) \cdot \sin\sqrt{(\gamma \cdot B_1)^2 + (\Delta\omega - \delta\omega_a)^2} \cdot \frac{t_p^2}{2} \right\|$$

Thus given the pulse width $t_p$ this is a model with 4 free parameters: af, c, $B_1$, and $\delta\omega_a$. Where af, c only describe the amplitude modulation independent of the frequency offset, the parameter B1 changes the periodicity and the parameter $\delta\omega_a$, the symmetry axis of the function (see FIG. 9). By sampling $Z(\Delta\omega)$ for several frequency offsets around $\delta\omega_a$, both the water frequency shift $\delta\omega_a$, as well as the B1 amplitude of the pulse can be determined simultaneously in each voxel.

Equation (4) is fitted to the acquired data; employing the correct scanner frequency and the gyromagnetic factor=2π·42.578 MHz/T the WASABI method yields B0 and B1 inhomogeneity maps.

FIG. 9 shows WASABI data according to equation 4 for different parameters B0, B1, af, and c (dots), obtained with conventional least squares optimization with 100 iterations (line) and inventive NN based input parameter creation with subsequent regression with only 2 iterations (dashed line) (B1 about in a range from 1.5 to 7 T, dB0 about in a range from −0.6 to 0.9, c about in a range from 0.2 to 0.8, and af about in a range from 1 to 2).

As shown in FIG. 9, the application of the conventional direct least squares method can fall into local minima (FIG. 9D to 9F). Advantageously, this is solved by the inventive 2-iteration optimization with NN estimation of start parameters (FIG. 9A to 9C). Even in the case of success of the direct least squares method, the NN based estimation is about 10 times faster (0.0114 for 81 fits) than the least-squares with constant starting values (0.1095 s for 81 fits).

FIG. 10 shows the resulting B1 and B0 maps obtained by WASABI in vivo in the human brain at 9.4 T, with least squares optimization with 100 iterations in FIGS. 10A and 10B and the NN based optimization with only 2 iterations in FIGS. 10C and 10D. FIG. 10A shows a jump in the B0 and B1 fields above the nasal cavity, this reflects a local minimum as demonstrated in FIG. 9. FIGS. 10C/D show the improvement of the B1 and B0 mapping when using the inventive NN based method: the B1 and B0 fields are smooth and continue nicely into the nasal cavity affected area. As an alternative to least squares optimization, instead of the inventive NN based optimization also each spectrum can be compared to a lookup table using the sum-of-squared-difference to find fit starting values (see [10]).

While this method is also avoiding local minima, it is 20 times slower compared to the inventive method (see following table).

| Method | Performance |
| --- | --- |
| Levmar 100 iterations and table lookup | 611 seconds, good performance |
| Levmar 100 iterations | 122 seconds, bad performance around nasal cavities |
| NN, Levmar 2 iterations: | 34 seconds, good performance |

Levmar: Levenberg-Marquardt algorithm

3. Multi-Exponential Relaxation

In relaxation measurement such as T1 or T2 mapping of biological samples often multi-exponential decays can be observed. Here, the inventive NN based input parameter prediction can as well provide good initial parameters for non-linear fitting routines. In particular, the inventors have found that for time series data such as multi-exponential decays NNs can improve the non-linear parameter estimation for MR data of living tissue.

The non-linear function of MR data S for a 3-exponential decay is represented by $$S = a_1 * \exp(-R_1 * 0) + a_2 * \exp(-R_2 * t) + a_3 * \exp(-R_3 * t) \qquad (5)$$

where $a_i$ are the compartments (representing volumes including matter with a certain relaxation rate) and $R_i$ are the relaxation rates in each compartment. According to the invention, a NN being trained to multi-exponential target data is used for predicting input parameters for the regression providing $a_i$ and $R_i$ based on measured MR data.

Figure 11:
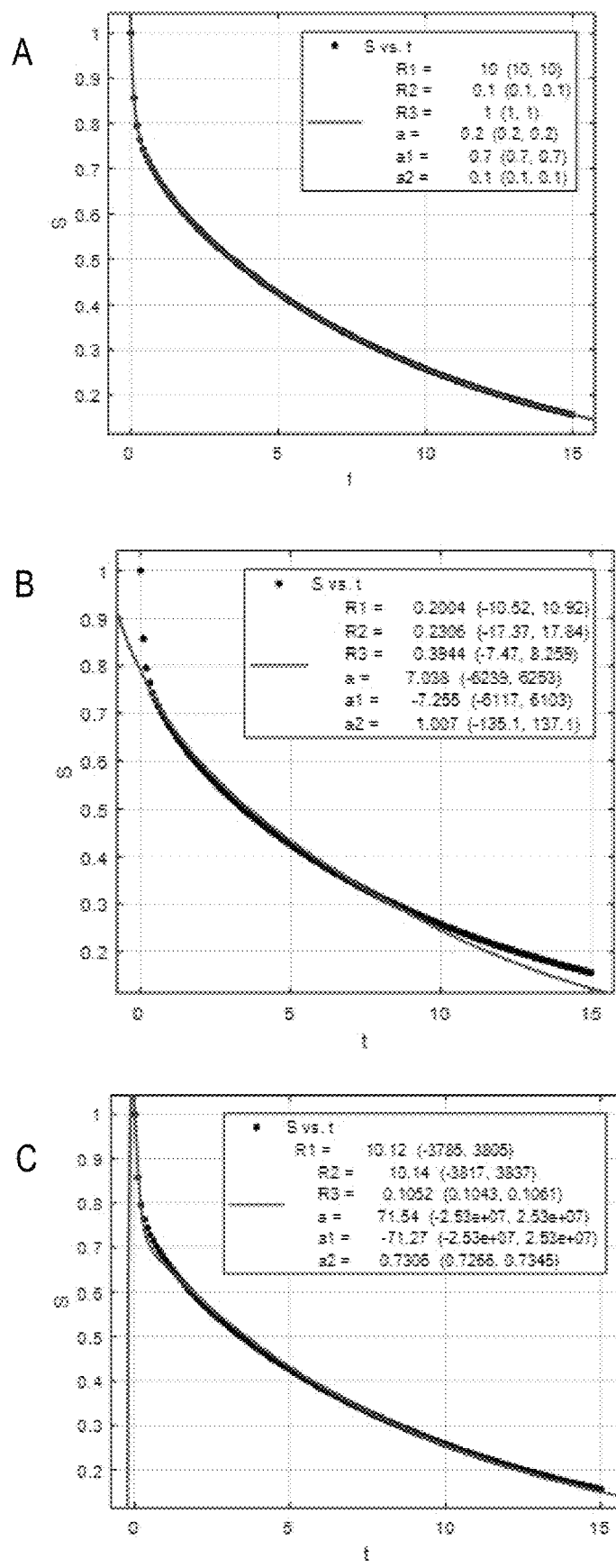

FIG. 11A shows the result of a 3-exponential decay fitting for well estimated input parameters created according to the invention (FIG. 11A).

$$S = 0.7 * \exp(-R_1 * t) + 0.1 * \exp(-R_2 * t) + 0.2 * \exp(-R_3 * t)$$

For conventionally estimated poor input parameters, fitting the same data results in local minima fits that yield wrong estimation of at least one compartment/relaxation rate (FIGS. 11B, 11C.)

As in MR data of biological samples the compartments and relaxation rates as well as the actual number of compartments can change strongly between different tissues, the invention allows for fast and robust avoidance of local minima for multi-exponential decay or recovery data fitting. In addition also the number of compartments and thus the actual necessary fit model can be estimated by the invention.

4. Further Applications

Further applications of the invention are available in exponential T1, T2 mapping, multi-exponential T1 and T2 spectroscopy, spectroscopic imaging, metabolite concentration mapping, compartmental mapping of parameters, partial volume, fat-water, pharmacokinetic, etc., ADC-mapping, for varying b-values, Kurtosis, perfusion and dynamic contrast enhanced imaging (modeling of input function, glucose, gag, OMG, etc.), MR-CEST imaging (Z-spectra by Multi-Lorentzian, or Henkelman-based water, MT and CEST pool fits), field mapping (B1, B0), e.g. Bloch-Siegert, multi-flip angle, DREAM, WASABI, and/or motion, breathing, pulsation measurements with known non-linear influence.

The features of the invention disclosed in the above description, the drawings and the claims can be of significance both individually as well as in combination or sub-combination for the realization of the invention in its various embodiments. The invention is not restricted to the preferred embodiments described above. Rather a plurality of variants and derivatives is possible which also use the inventive concept and therefore fall within the scope of protection. In addition, the invention also claims protection for the subject and features of the subclaims independently of the features and claims to which they refer.

What is claimed is:

1. A method of processing magnetic resonance (MR) data of a sample under investigation, comprising the steps of:
providing the MR data being collected with an MRI scanner apparatus, and
subjecting the MR data to a multi-parameter nonlinear regression procedure based on a non-linear MR signal model and employing a set of input parameters, wherein the regression procedure results in creating a parameter map of model parameters of the sample, wherein
the input parameters of the regression procedure are estimated by a machine learning based estimation procedure applied to the MR data.

2. The method according to claim 1, wherein the machine learning based estimation procedure comprises at least one of
at least one neural network, and
a support vector machine.

3. The method according to claim 1, wherein the machine learning based estimation procedure is an estimation procedure trained by at least one of simulation data, real data and manipulated real data.

4. The method according to claim 1, wherein the input parameters of the regression procedure are estimated by using a combination of an estimation procedure trained by simulation data, an estimation procedure trained by real data, and an estimation procedure trained by real but manipulated data.

5. The method according to claim 1, wherein the machine learning based estimation procedure is applied separately on N-dimensional MR data of voxels of the sample under investigation, wherein N refers to one or more sample features collected within each voxel.

6. The method according to claim 1, wherein the regression procedure includes a single iteration step for creating the parameter map of model parameters from the input parameters.

7. The method according to claim 1, including further steps of repeating the steps of estimating the input parameters and subjecting the MR data to the multi-parameter nonlinear regression procedure with a changed configuration of the machine learning based estimation procedure, until the parameter map of the model parameters provides a realistic approximation of the sample.

8. The method according to claim 1, wherein the non-linear MR model comprises at least one of a Bloch equation based MR signal model, an MR signal model based on adapted Bloch equations, a magnetic field mapping model and a T1 and T2 relaxation times estimating model.

9. The method according to claim 1, wherein the MR data comprise at least two phase and/or magnitude images and/or MR raw data being collected with the MRI scanner apparatus.

10. The method according to claim 1, wherein the step of estimating the input parameters is included in an image reconstruction procedure conducted by the MRI scanner apparatus.

11. The method according to claim 1, wherein the step of estimating the input parameters is conducted separately from operation of the MRI scanner apparatus.

12. The method according to claim 1, wherein the parameter map of the sample comprises at least one of
an exponential T1, T2 map,
a multi-exponential T1, T2 map,
a spectroscopic imaging map,
a compartmental map of parameters,
an apparent diffusion coefficient (ADC)-map for varying B-values,
a Kurtosis parameter map,
a parameter map of perfusion and dynamic contrast enhanced imaging for Gadolinium based contrast agents as well as glucose, or glycosamines or oxymethyl glucose (OMG),
a parameter map of spectroscopic imaging of nuclei,
a parameter map of CEST parameters,
a field parameter map (B1, B0), and
a parameter map representing at least one of motion, breathing and pulsation with known non-linear influence.

13. The method according to claim 12, wherein the parameter map of the sample comprises the parameter map of CEST parameters including Z-spectra modelled by Multi-Lorentzian regression, or Henkelman-based water, MT and CEST pool regression of effect strength, proton pool sizes and exchange and relaxation rates.

14. The method according to claim 12, wherein the parameter map of the sample comprises the field parameter map (B1, B0) including Bloch-Siegert shift based B1 mapping, multi-flip angle mapping, DREAM or WASABI.

15. A magnetic resonance imaging (MRI) scanner apparatus, comprising
an MRI scanner signal acquisition device arranged for collecting MR data, and
a data processing unit that includes a regression processor configured for subjecting the MR data to a multi-parameter nonlinear regression procedure based on a non-linear MR model, wherein the regression procedure includes creating a parameter map of model parameters of a sample using a set of input parameters of the regression procedure, wherein
the data processing unit includes an estimator section configured for estimating the input parameters of the regression procedure by applying a machine learning based estimation procedure on the MR data.

* * * * *